(12) United States Patent
Mudholkar et al.

(10) Patent No.: US 10,388,801 B1
(45) Date of Patent: Aug. 20, 2019

(54) TRENCH SEMICONDUCTOR DEVICE HAVING SHAPED GATE DIELECTRIC AND GATE ELECTRODE STRUCTURES AND METHOD

(71) Applicant: SEMICONDUCTOR COMPONENTS INDUSTRIES, LLC, Phoenix, AZ (US)

(72) Inventors: Mihir Mudholkar, Tempe, AZ (US); Mohammed T. Quddus, Chandler, AZ (US); Ikhoon Shin, Pocatello, ID (US); Scott M. Donaldson, Pocatello, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/883,500

(22) Filed: Jan. 30, 2018

(51) Int. Cl.
*H01L 29/872* (2006.01)
*H01L 29/06* (2006.01)
*H01L 29/40* (2006.01)
*H01L 29/66* (2006.01)

(52) U.S. Cl.
CPC ........ *H01L 29/872* (2013.01); *H01L 29/0619* (2013.01); *H01L 29/0649* (2013.01); *H01L 29/401* (2013.01); *H01L 29/404* (2013.01); *H01L 29/407* (2013.01); *H01L 29/66143* (2013.01)

(58) Field of Classification Search
CPC ... H01L 29/872; H01L 29/407; H01L 29/401; H01L 29/66143; H01L 29/0649; H01L 29/0619; H01L 29/404
See application file for complete search history.

(56) References Cited

U.S. PATENT DOCUMENTS

| 5,111,253 A * | 5/1992 | Korman | H01L 27/0727 257/341 |
| 5,262,669 A * | 11/1993 | Wakatabe | H01L 29/861 257/483 |
| 5,365,102 A * | 11/1994 | Mehrotra | H01L 29/872 257/471 |

(Continued)

*Primary Examiner* — Earl N Taylor
(74) *Attorney, Agent, or Firm* — Kevin B. Jackson

(57) ABSTRACT

A semiconductor device includes a region of semiconductor material having first and second opposing major surfaces. A trench structure includes a trench extending into the region of semiconductor material from the first major surface, wherein the first major surface defines a first horizontal plane in a cross-sectional view. The trench structure further includes a conductive material disposed within the trench and separated from the region of semiconductor material by a dielectric region. A Schottky contact region is disposed adjacent the first major surface on opposing sides of the trench structure, the Schottky contact region having an upper surface residing on a second horizontal plane in the cross-sectional view. The dielectric region comprises an uppermost surface and configured such that a major portion of the uppermost surface is disposed above the first horizontal plane in the cross-sectional view. The structure and method provide a semiconductor device with improved performance (e.g., reduced leakage and more stable breakdown voltage) and improved reliability.

20 Claims, 11 Drawing Sheets

(56) References Cited

U.S. PATENT DOCUMENTS

| | | | | |
|---|---|---|---|---|
| 5,612,567 A * | 3/1997 | Baliga | H01L 29/872 | 257/475 |
| 5,679,966 A * | 10/1997 | Baliga | H01L 29/7391 | 257/139 |
| 5,859,465 A * | 1/1999 | Spring | H01L 29/872 | 257/481 |
| 5,949,124 A * | 9/1999 | Hadizad | H01L 23/585 | 257/487 |
| 5,998,833 A * | 12/1999 | Baliga | H01L 21/82348 | 257/329 |
| 6,078,090 A * | 6/2000 | Williams | H01L 27/0255 | 257/334 |
| 6,309,929 B1 * | 10/2001 | Hsu | H01L 29/0661 | 438/270 |
| 6,441,454 B2 * | 8/2002 | Hijzen | H01L 29/407 | 257/339 |
| 6,498,367 B1 * | 12/2002 | Chang | H01L 21/2815 | 257/341 |
| 6,515,330 B1 * | 2/2003 | Hurtz | H01L 29/7811 | 257/328 |
| 6,537,921 B2 * | 3/2003 | Metzler | H01L 27/0814 | 438/719 |
| 6,656,843 B2 * | 12/2003 | Bol | H01L 21/28537 | 257/E21.163 |
| 6,855,593 B2 * | 2/2005 | Andoh | H01L 27/0814 | 257/E21.359 |
| 6,977,208 B2 * | 12/2005 | Chiola | H01L 21/763 | 257/471 |
| 6,979,874 B2 * | 12/2005 | Harada | H01L 29/66136 | 257/283 |
| 7,034,376 B2 * | 4/2006 | Okada | H01L 29/66143 | 257/471 |
| 7,045,397 B1 * | 5/2006 | Yu | H01L 29/66848 | 257/135 |
| 8,766,279 B1 * | 7/2014 | Yen | H01L 29/8725 | 257/77 |
| 9,911,816 B2 * | 3/2018 | Boettcher | H01L 29/404 | |
| 2005/0161758 A1 * | 7/2005 | Chiola | H01L 21/763 | 257/471 |
| 2007/0145429 A1 * | 6/2007 | Francis | H01L 27/0641 | 257/260 |
| 2009/0057756 A1 * | 3/2009 | Hshieh | H01L 29/0661 | 257/330 |
| 2011/0227152 A1 * | 9/2011 | Hsu | H01L 29/66143 | 257/334 |
| 2012/0205772 A1 * | 8/2012 | Chen | H01L 29/0623 | 257/471 |
| 2013/0200451 A1 * | 8/2013 | Yilmaz | H01L 29/4236 | 257/331 |
| 2013/0228891 A1 * | 9/2013 | Kao | H01L 21/28008 | 257/494 |
| 2014/0077287 A1 * | 3/2014 | Xu | H01L 29/66356 | 257/328 |
| 2015/0333132 A1 * | 11/2015 | Yeh | H01L 21/30604 | 257/488 |
| 2015/0333133 A1 * | 11/2015 | Boettcher | H01L 29/404 | 257/488 |
| 2016/0260844 A1 * | 9/2016 | Quddus | H01L 29/36 | |
| 2016/0260845 A1 * | 9/2016 | Quddus | H01L 29/36 | |
| 2017/0040423 A1 * | 2/2017 | Inoue | H01L 29/42372 | |

* cited by examiner

TRENCH SEMICONDUCTOR DEVICE HAVING SHAPED GATE DIELECTRIC AND GATE ELECTRODE STRUCTURES AND METHOD

CROSS-REFERENCE TO RELATED APPLICATIONS

Not Applicable.

BACKGROUND

The present invention relates, in general, to electronics and, more particularly, to semiconductor device structures and methods of forming semiconductor devices.

A Schottky device is a type of semiconductor device that exhibits a low forward voltage drop and a very fast switching action. The lower forward voltage drop translates into less energy wasted as heat, which provides improved system efficiency and higher switching speed compared to conventional PN junction diodes. This makes Schottky devices more suitable for applications requiring higher efficiency power management. Such applications include wireless/portable devices, boost converters for LCD/keypad backlighting, charge circuits as well as other small signal applications.

With demands to further improve battery life in these applications and others, the market is requiring even higher efficiency devices, such as Schottky devices having lower power dissipation, higher power density, and smaller die size. Some Schottky devices are formed using insulated trench gated structures, which have improved performance in some areas. However, related insulated trench gated Schottky device designs have not provided adequate yields because of issues associated with interfaces between the semiconductor material where the Schottky contact is made, the gate dielectric, and the gate electrode. Such yields issues have included, for example, high leakage currents and premature or low breakdown voltages.

Accordingly, it is desired to have structures and methods for forming Schottky devices that overcome the issues of related devices including those described previously. Additionally, it is also beneficial for the structures and methods to be cost effective and easy to integrate into preexisting process flows.

Figure 1:
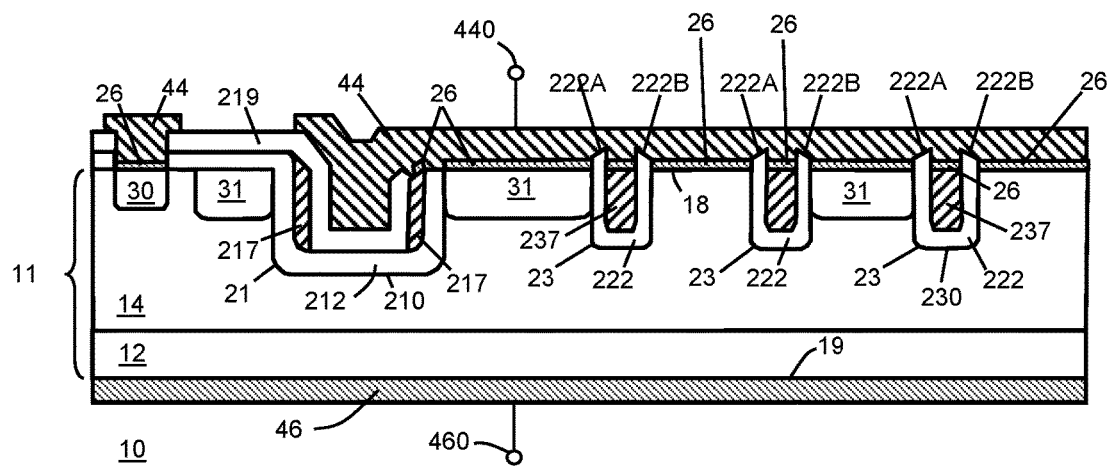
FIG. 1 illustrates a partial cross-sectional view of an example of a semiconductor device in accordance with the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular examples only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the examples illustrated and described hereinafter suitably may have examples and/or may be practiced in the absence of any element that is not specifically disclosed herein.

DETAILED DESCRIPTION OF THE DRAWINGS

In general, the present embodiments relate to a semiconductor device and method of forming the semiconductor device having a shaped gate dielectric region proximate to a portion of the semiconductor device where the Schottky contact region is formed and another portion of the semiconductor device where the gate electrode adjoins a major surface of the semiconductor device. More particularly, the shaped gate dielectric region comprises an uppermost surface having a profile in cross-sectional view other than a substantially downward sloping profile between where the gate dielectric region adjoins the semiconductor material where the Schottky contact region is to be formed, and where the gate dielectric region adjoins the gate electrode. Stated differently, a major portion (e.g., at least 50% or more) of the uppermost surface of the gate dielectric region resides above a plane defined by a major surface of the contact region of the semiconductor material where the Schottky contact region is to be formed.

In some examples, all or substantially all of the uppermost surface of the gate dielectric region resides above a plane defined by a major surface of the semiconductor material after a contact etch step is completed during fabrication where the Schottky contact is to be formed. In other examples, a major portion (e.g., at least 50% or more) of the uppermost surface of the gate dielectric region resides above a plane defined by an upper surface of the Schottky contact region. In further examples, all or substantially all of the uppermost surface of the gate dielectric region resides above a plane defined by the uppermost surface of the Schottky contact region.

It was found that a gate dielectric region with an uppermost surface having a profile that slopes substantially downward between where the gate dielectric region adjoins the Schottky contact region of the semiconductor material and where the gate dielectric region adjoins the gate electrode, or where a substantial portion of the uppermost surface of the gate dielectric region resides below a plane defined by a major surface of the semiconductor material where the Schottky contact region is to be formed as is in previous semiconductor devices, negative yield and performance issues are observed.

More particularly, in one example a semiconductor device includes a region of semiconductor material having first and second opposing major surfaces. A trench structure includes a trench extending into the region of semiconductor material from the first major surface, wherein the first major surface defines a first horizontal plane in a cross-sectional view. The trench structure further includes a conductive material disposed within the trench and separated from the region of semiconductor material by a dielectric region. A Schottky contact region is disposed adjacent the first major surface on opposing sides of the trench structure, the Schottky contact region having an upper surface residing on a second horizontal plane in the cross-sectional view. The dielectric region comprises an uppermost surface and is configured such that a major portion of the uppermost surface is disposed above the first horizontal plane in the cross-sectional view.

In another example, a semiconductor device includes a region of semiconductor material having first and second opposing major surfaces. A trench structure includes a trench extending into the region of semiconductor material from the first major surface, wherein the first major surface defines a first horizontal plane in a cross-sectional view. The trench structure further includes a conductive material disposed within the trench and separated from the region of semiconductor material by a dielectric region. A Schottky contact region is disposed adjacent the first major surface on opposing sides of the trench structure, the Schottky contact region having an upper surface residing on a second horizontal plane in the cross-sectional view. The dielectric region comprises an uppermost surface and is configured such that a major portion comprising 50% or more of the uppermost surface is disposed above the first horizontal plane in the cross-sectional view.

In a further example, a method of forming a semiconductor device, includes providing a region of semiconductor material having first and second opposing major surfaces. The method includes forming a trench extending into the region of semiconductor material from the first major surface and forming a first layer of material overlying surfaces of the trench and the first major surface, the first layer of material comprising a dielectric material. The method includes forming a second layer of material overlying the first layer of material, the second layer of material comprising a conductive material, wherein the second layer of material comprises a notch extending inward from an upper surface of the second layer of material above the trench. The method includes removing a first portion of the second layer of material using an etch planarization step and removing a second portion of the second layer of material using a different planarization step, wherein the step of removing the second portion of the second layer of material provides conductive material within the trench comprising a flared-out portion proximate to an upper surface of the conductive material. The method includes removing a portion of the first layer of material to expose portions of the first major surface and to provide a dielectric region within the trench, wherein: the dielectric region separates the conductive material from the region of semiconductor material, the dielectric material comprises an uppermost surface, and a major portion of the uppermost surface is disposed above a first horizontal plane defined by the exposed portions of the first major surface in a cross-sectional view. The method includes forming a Schottky contact region adjacent at least one of the exposed portions of the first major surface adjoining the trench. In one example, the step of removing the first portion of the second layer of material comprises providing the second portion of the second layer of material having a thickness of approximately 0.15 microns. In another example, the step of removing the second portion of the second layer of material comprises using chemical mechanical planarization. In a further embodiment, the step of removing the portion of the first layer of material includes providing the major portion comprising 50% or more of the uppermost surface disposed above the first horizontal plane.

FIG. 1 illustrates an enlarged partial cross-sectional view of an electronic device 10, a semiconductor device 10, Schottky diode device 10, or trench Schottky rectifier 10 in accordance with one example. In the present example, device 10 includes a region of semiconductor material 11, which includes a major surface 18 and an opposing major surface 19. Region of semiconductor material 11 can include a bulk substrate 12, such as an N-type silicon substrate having a resistivity ranging from about 0.001 ohm-cm to about 0.005 ohm-cm. By way of example, substrate 12 can be doped with phosphorous, arsenic, or antimony.

Device 10 further includes a semiconductor layer 14, doped region 14, or doped layer 14, which can be formed in, on, or overlying substrate 12. In one example, semiconductor layer 14 can be an N-type conductivity region or layer, and can be formed using epitaxial growth techniques, ion implantation and diffusion techniques, or other techniques known to those of ordinary skill in the art. In one example, semiconductor layer 14 includes major surface 18 of region of semiconductor material 11. In some examples, semiconductor layer 14 has a dopant concentration less than the dopant concentration of substrate 12. The dopant concentration and/or dopant profile of semiconductor layer 14 can be selected to provide a desired breakdown voltage and forward voltage drop. It is understood that region of semiconductor material 11, semiconductor substrate 12, and/or semiconductor layer 14 can include other types of materials including, but not limited to, heterojunction semiconductor materials, and semiconductor substrate 12 and semiconductor layer 14 can each include different materials. Such materials can include SiGe, SiGeC, SiC, GaN, AlGaN, and other similar materials as known to those of ordinary skill in the art.

Device 10 includes a first trench 21 or termination trench 21 and second trenches 23 or active trench 23. By way of example, termination trench 21 can be disposed in an edge portion of region of semiconductor material 11 and active trenches 23 can be disposed inward from termination trench 21 such that termination trench 21 is interposed between the edge portion of region of semiconductor material 11 and active trenches 23. In some examples, termination trench 21 completely surrounds active trenches 23. In one example, termination trench 21 extends from major surface 18 into semiconductor layer 14 towards semiconductor substrate 12. In some examples, termination trench 21 can extend into semiconductor substrate 12. In other examples, termination trench 21 can terminate within semiconductor layer 14 thereby leaving a portion of semiconductor layer 14 disposed between a lower extent of termination trench 21 and semiconductor substrate 12. In one example, termination trench 21 includes a dielectric layer 212, a dielectric region 212, or a dielectric structure 212 disposed adjoining sidewall and lower surfaces of termination trench 21 as generally illustrated in FIG. 1.

Dielectric layer 212 defines a lower surface 210 of termination trench 21 at a distance inward from major surface 18. It is understood that lower surface 210 may not be flat, but may have other shapes including, but not limited to curved, rounded, partially-curved, or partially-rounded shapes. In one example, dielectric layer 212 can be a thermal oxide having a thickness in a range from approximately 0.05 microns to approximately 0.5 microns. In other examples, dielectric layer 212 can be other types of oxides, nitrides, combinations thereof, or other materials known to those of ordinary skill in the art.

In one example, termination trench 21 further includes one or more conductive spacers 217 along sidewall surfaces adjoining dielectric layer 212. In one example, conductive spacers 217 can be a conductive polycrystalline material, such as a doped polysilicon (e.g., N-type or P-Type). In one example, a dielectric layer 219, a dielectric region 219, or a dielectric structure 219 is disposed within termination trench 21. In one example, dielectric layer 219 can be further disposed on or adjacent a portion of major surface 18 spaced away from active trenches 23 as generally illustrated in FIG. 1. In one example, dielectric layer 219 can be a deposited dielectric material, such as a deposited oxide, a deposited nitride, combinations thereof, or other dielectric materials as known to those of ordinary skill in the art. In one preferred example, dielectric layer 219 can be an oxide deposited using a tetra-ethyl-ortho-silicate ("TEOS") source using plasma-enhanced chemical vapor deposition ("PECVD") or low pressure chemical vapor deposition ("LPCVD"), and can have a thickness in a range from approximately 0.2 microns to approximately 1.0 micron. In some examples, termination trench 21 can have a width in a range from approximately 4 microns to approximately 20 microns. In one example, termination trench 21 can have a width of approximately 10 microns.

In the present example, device 10 includes active trenches 23 extending from major surface 18 into semiconductor layer 14 towards semiconductor substrate 12. In one example, active trenches 23 include a gate dielectric region 222, a gate dielectric layer 222, a dielectric layer 222, a dielectric region 222, or a dielectric structure 222 disposed adjoining sidewall and lower surfaces of active trenches 23. Dielectric layer 222 defines a lower surface 230 of active trenches 23. It is understood that lower surfaces 230 may not be flat, but can have other shapes including, but not limited to curved, rounded, partially-curved, or partially-rounded shapes. In one example, dielectric layers 222 comprise a thermal oxide having a thickness in a range from approximately 0.05 microns to approximately 0.6 microns. In some examples, dielectric layer 212 and dielectric layers 222 can be the same material. In some examples, dielectric layer 212 and dielectric layer 222 can be formed during the same process step.

Active trenches 23 further include a conductive layer 237, a conductive region 237, a gate electrode 237, or a conductive material 237 provided along surfaces adjoining dielectric layer 222. In one example, conductive material 237 can be a conductive polycrystalline material, such as a doped polysilicon. In some examples, active trenches 23 can have a width in a range from approximately 0.1 microns to approximately 0.6 microns. In one example, active trenches 23 can have a width of approximately 0.2 microns to approximately 1.0 microns. By way of example, the width of active trenches 23 is modified depending on the breakdown voltage rating of device 10. In some examples, device 10 can have an active trench 23 width to termination trench 21 width ratio in a range from approximately 0.005 to approximately 0.125. In other examples, device 10 can have an active trench 23 width to termination trench 21 width ratio less than approximately 0.03.

In accordance with the present example, dielectric layers 222 comprise uppermost surfaces 222A and 222B that are intentionally shaped or formed having a profile in a cross-sectional view where a major portion or a substantial portion (e.g., at least 50% or more) of uppermost surfaces 222A and 222B reside above a generally horizontal plane defined by major surface 18 of region of semiconductor material 11 (or semiconductor layer 14) prior to the formation of Schottky contact regions 26. This is more readily observed, for example, in FIG. 2, which illustrates contact region 118 of major surface 18 of region of semiconductor material 11 on the left side of active trench 23 before Schottky contact region 26 is formed, and further illustrates Schottky contact region 26 on the right side of active trench 23 after it is formed. As will be explained in more detail later, Schottky contact region 26 typically comprises a material that reacts with region of semiconductor material 11 during, for example, a thermal process to form a silicide region. Any unreacted material can then be removed using, for example, an etch process. As a result, the location of major surface 18 may be different after forming Schottky contact region 26. For purposes of the present description, reference to uppermost surfaces 222A and 222B is made with respect to the location of major surface 18 prior to the formation of Schottky contact regions 26.

In other examples, a major portion or a substantial portion (e.g., at least 50% or more) of uppermost surfaces 222A and 222B reside above a generally horizontal plane defined by the upper surface of Schottky contact regions 26. In some examples, all or substantially all of uppermost surfaces 222A and 222B reside above at least a portion of the upper surface of Schottky contact regions 26. In still further examples, all or substantially all of the uppermost surfaces 222A and 222B reside above the upper surface of Schottky contact regions 26.

In some examples, uppermost surfaces 222A and 222B have a profile in the cross-sectional view other than one that substantially slopes downward between where dielectric layers 222 adjoin region of semiconductor material 11 (or semiconductor layer 14) and where dielectric layers 222 adjoin conductive material 237 in active trenches 23. In some examples, all or substantially all of uppermost surfaces 222A and 22B reside above a plane defined by major surface 18 of region of semiconductor material 11 (or semiconductor layer 14) after the formation of contact regions 118 and before the formation of Schottky contact regions 26. Examples of profiles for uppermost surfaces 222A and 222B will be further described later in conjunction with FIGS. 2 through 10.

Device 10 further includes Schottky contact regions 26, contact regions 26, conductive layers 26, conductive region or regions 26, or conductive material 26 disposed adjoining portions of major surface 18. In some examples, conductive material 26 also can be disposed adjoining upper surface portions of conductive material 237 and upper surface portions of at least one of conductive spacers 217. Conductive material 26 comprises a material configured to provide a Schottky barrier with region of semiconductor material 11 or semiconductor layer 14. Such materials can include platinum, nickel-platinum (with various platinum atomic weight percentages, for example, from approximately 1% to approximately 80%, with 5% being selected in some examples), titanium, titanium-tungsten, chromium, and/or other materials capable of forming a Schottky barrier as known to those skilled in the art.

In some examples, device 10 may also include one or more doped regions 31, which can be either N-type or P-type provided adjacent major surface 18 and adjacent Schottky contact regions 26. In one example, doped regions 31 can be configured to provide clamping action in reverse bias to improve the dynamic robustness of device 10. In other examples, doped region 31 can extend laterally across semiconductor layer 14 adjacent major surface 18 and can be configured to adjust barrier height in device 10. Doped regions 31 can be provided using ion implantation and anneal techniques, epitaxial growth techniques, or other doping techniques as known to those of ordinary skill in the art. In one example, doped regions 31 extend into region of semiconductor material 11 deeper than the bottoms of active trenches 23 when doped regions 31 are used for dynamic clamping or conduction tuning. In other examples, doped regions 31 can be provided in only some mesa regions and not in others to provide different Schottky barrier heights between mesa regions. When doped region 31 are used for barrier height adjustment, doped regions 31 typically have depth less than approximately 1.0 micron.

In some examples, device 10 may include a deeper doped region (not illustrated) provided below doped regions 31 to provide for conduction tuning of the device. This may also be done by providing, for example, a graded dopant profile within semiconductor layer 14 by using graded epitaxial growth techniques or by using multiple ion implants.

In some examples, device 10 may include a doped region 30 or an edge seal region 30 disposed between termination trench 21 and the edge or periphery of region of semiconductor material 11. In some examples, doped region 30 comprises the same conductivity type as semiconductor layer 14, which in the present example is N-type, and can be formed using ion implantation and anneal processes. In some examples, doped region 30 is heavily doped to provide low contact resistance to conductive layer 44. Doped region 30 can be P-type when semiconductor layer 14 is P-type. Doped region 30 can be configured to reduce current leakage issues caused by, for example, edge defects. It is understood that doped region 30 may not be included in some examples. In some examples, a Schottky contact region 26 may also be disposed adjoining doped region 30 adjacent to major surface 18 of region of semiconductor 11 as generally illustrated in FIG. 1.

A conductive layer 44 can be formed overlying major surface 18 and a conductive layer 46 can be formed overlying major surface 19. Conductive layers 44 and 46 can be configured to provide electrical connection between device 10 and a next level of assembly, such as a semiconductor package structure. In accordance with the present example, conductive layer 44 is electrically connected to Schottky contact regions 26. In one example, conductive layer 44 can be titanium/titanium-nitride/aluminum-copper or other related or equivalent materials known by one of ordinary skill in the art and is configured as first current carrying electrode or terminal 440 or an anode electrode 440 for device 10. In one example, conductive layer 46 can be a solderable metal structure such as titanium-nickel-silver, chromium-nickel-gold, or other related or equivalent materials known by those skilled in the art. In the example illustrated, conductive layer 46 provides a second current carrying electrode or terminal 460 or a cathode electrode 460 for device 10.

In accordance with the present example, uppermost surfaces 222A and 222B of dielectric regions 222 are configured to improve sidewall protection of trenches 23 by dielectric regions 222. This improved sidewall protection reduces, for example, the effects of creep or migration of Schottky contact regions 26 onto dielectric regions 222 at the upper edge of semiconductor layer 14 or the upper edge of the mesa regions formed between adjacent active regions 23. This reduces leakage issues. In addition, uppermost surfaces 222A and 222B of dielectric regions 222 are configured to reduce electric field buildup at the corner edge regions of the mesas thereby improving breakdown voltage performance of device 10.

Turning now to FIGS. 2-10, various examples of configurations for uppermost surfaces 222A and 222B of dielectric regions are described. Conductive layers 44 and 46 are not shown so as to simplify the present description.

Figure 2:
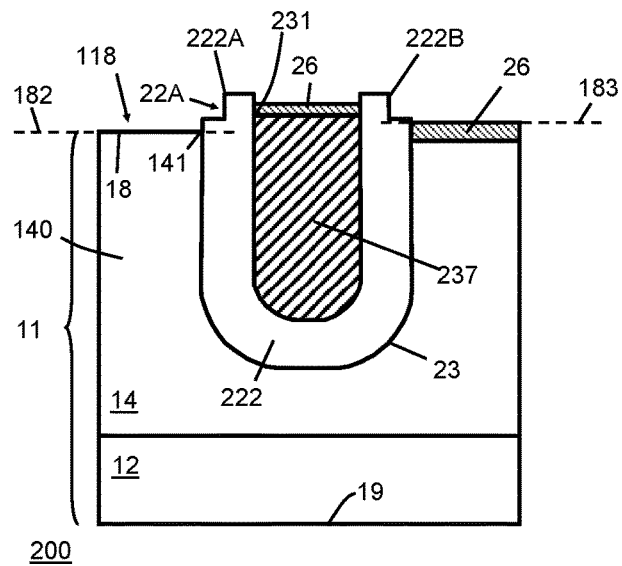
FIGS. 2-9 illustrate partial and enlarged cross-sectional views of examples of semiconductor devices structures in accordance with the present description.

FIG. 2 illustrates a partial cross-sectional view of a portion of a device 200 or a semiconductor device 200 having active trench 23, dielectric region 222, Schottky contact region(s) 26, and conductive material 237. In the present example, contact region 118 of region of semiconductor material 11 at major surface 18 is illustrated on the left side of active trench 23, and a Schottky contact region 26 is illustrated on the right side of active trench 23. This is done for illustration purposes only, and it is understood that in a finished device 200, a Schottky contact region 26 is also provided on the left side of active trench 23.

In device 200, all or substantially all of uppermost surfaces 222A and 222B of dielectric region 222 reside above a generally horizontal plane 182 defined by major surface 18 of region of semiconductor material 11 (or semiconductor layer 14) in contact region 118 at least prior to the formation of Schottky contact region 26. In other examples, a major portion of uppermost surfaces 222A and 222B (e.g., at least 50% or more) reside above horizontal plane 182. In the present example, uppermost surface 222A has stepped or step-like shape 22A in cross-sectional view, which steps upward going from an edge 141 of a mesa 140 portion of semiconductor layer 14 to an edge 231 of conductive material 237, which can lie above horizontal plane 182. It is understood that edge 231 can be other than a corner of conductive material 237. In the present example, uppermost surface 222B of dielectric region 222 also has a stepped or step-like shape, which is symmetric with reference to a vertical center line passing through the center of conductive material 237.

In some examples of device 200, a major portion of uppermost surfaces 222A and 222B (e.g., at least 50% or more) reside above a generally horizontal plane 183 defined by the upper surface of Schottky contact region 26. In some examples, all or substantially all of uppermost surfaces 222A and 222B reside above at least a portion of the upper surface of Schottky contact region 26. In still further examples, all or substantially all of the uppermost surfaces 222A and 222B reside above the upper surface of Schottky contact region 26.

Figure 3:
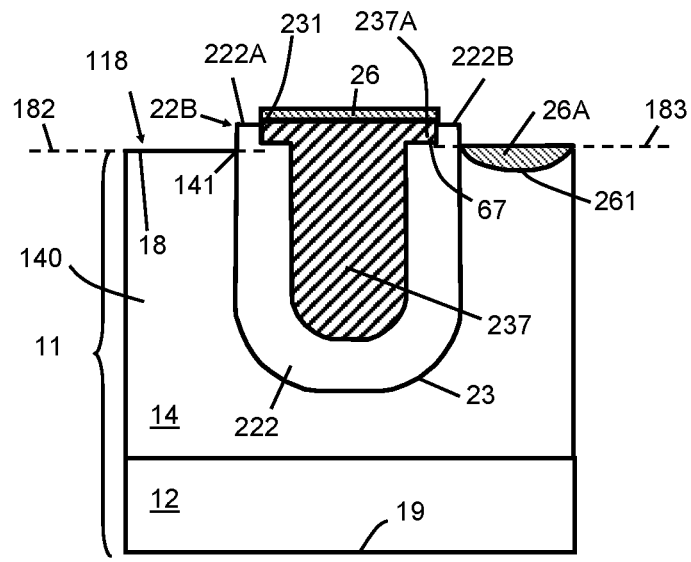

FIG. 3 illustrates a partial cross-sectional view of a portion of a device 300 or a semiconductor device 300 having active trench 23, dielectric region 222, Schottky contact region(s) 26, and conductive material 237. In the present example, contact region 118 of region of semiconductor material 11 at major surface 18 is illustrated on the left side of active trench 23, and a Schottky contact region 26A is illustrated on the right side of active trench 23. This is done for illustration purposes only, and it is understood that in a finished device 300, a Schottky contact region 26A is also provided on the left side of active trench 23. In accordance with the present example, Schottky contact region 26A is configured having an inward facing surface 261 into semiconductor layer 14 having a concave shape with respect to major surface 18. In some examples, Schottky contact region 26A comprises titanium silicide.

In device 300, all or substantially all of uppermost surfaces 222A and 222B of dielectric region 222 reside above horizontal plane 182 in contact region 118 at least before the formation of Schottky contact region 26A. In other examples, a major portion of uppermost surfaces 222A and 222B (e.g., at least 50% or more) reside above horizontal plane 182. In the present example, uppermost surface 222A has a square or rectangular like shape 22B in cross-sectional view, which steps upward from edge 141 of mesa 140 to edge 231 of conductive material 237, which can lie above horizontal plane 182. It is understood that edge 231 can be other than a corner of conductive material 237. In addition, in the present example, conductive material 237 is configured having a T-shape with edges 237A laterally extending into notches 67 disposed in dielectric region 222. In the present example, uppermost surface 222B of dielectric region 222 also as a rectangular like shape, which is symmetric with reference to a vertical center line passing through the center of conductive material 237.

In some examples of device 300, a major portion of uppermost surfaces 222A and 222B (e.g., at least 50% or more) reside above a generally horizontal plane 183 defined by the upper surface of Schottky contact region 26. In some examples, all or substantially all of uppermost surfaces 222A and 222B reside above at least a portion of the upper surface of Schottky contact region 26. In still further examples, all or substantially all of the uppermost surfaces 222A and 222B reside above the upper surface of Schottky contact region 26.

Figure 4:
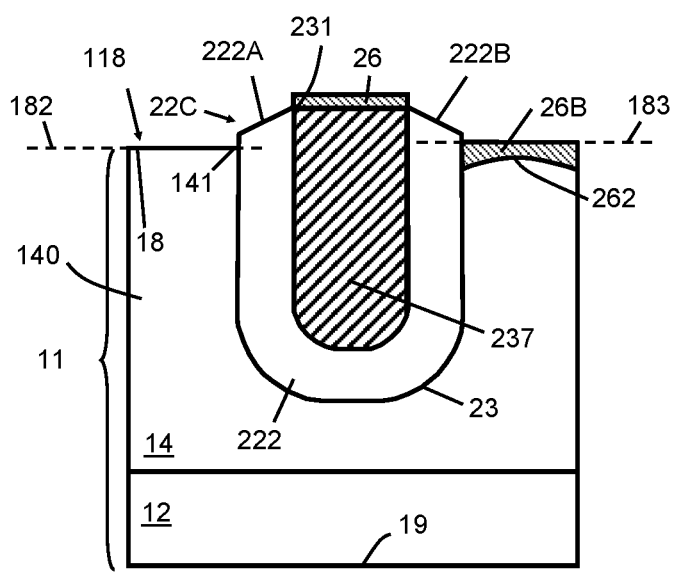

FIG. 4 illustrates a partial cross-sectional view of a portion of a device 400 or a semiconductor device 400 having active trench 23, dielectric region 222, Schottky contact region(s) 26, and conductive material 237. In this example, contact region 118 of region of semiconductor material 11 at major surface 18 is illustrated on the left side of active trench 23, and a Schottky contact region 26B is illustrated on the right side of active trench 23. This is done for illustration purposes only, and it is understood that in a finished device 400, a Schottky contact region 26A is also provided on the left side of active trench 23. In accordance with the present example, Schottky contact region 26B is configured having an outward facing surface 262 into semiconductor layer 14 having a convex shape with respect to major surface 18. In some examples, Schottky contact region 26B comprises nickel platinum silicide.

In device 400, all or substantially all of uppermost surfaces 222A and 222B of dielectric region 222 reside above horizontal plane 182 in contact region 118 at least before the formation of Schottky contact region 26B. In other examples, a major portion of uppermost surfaces 222A and 222B (e.g., at least 50% or more) reside above horizontal plane 182. In the present example, uppermost surface 222A has a trapezoid shape 22C in cross-sectional view, which steps upward from edge 141 of mesa 140 and upwardly slopes towards edge 231 of conductive material 237, which can lie above horizontal plane 182. It is understood that edge 231 can be other than a corner of conductive material 237. In the present example, uppermost surface 222B of dielectric region 222 also as a trapezoid shape, which is symmetric with reference to a vertical center line passing through the center of conductive material 237.

In some examples of device 400, a major portion of uppermost surfaces 222A and 222B (e.g., at least 50% or more) reside above a generally horizontal plane 183 defined by the upper surface of Schottky contact region 26. In some examples, all or substantially all of uppermost surfaces 222A and 222B reside above at least a portion of the upper surface of Schottky contact region 26. In still further examples, all or substantially all of the uppermost surfaces 222A and 222B reside above the upper surface of Schottky contact region 26.

Figure 5:
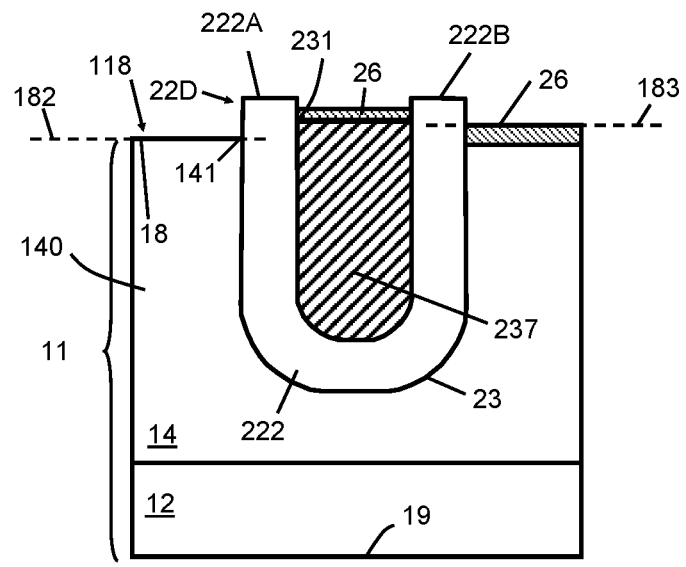

FIG. 5 illustrates a partial cross-sectional view of a portion of a device 500 or a semiconductor device 500 having active trench 23, dielectric region 222, Schottky contact region(s) 26, and conductive material 237. In the present example, contact region 118 of region of semiconductor material 11 at major surface 18 is illustrated on the left side of active trench 23, and a Schottky contact region 26 is illustrated on the right side of active trench 23. This is done for illustration purposes only, and it is understood that in a finished device 500, a Schottky contact region 26 is also provided on the left side of active trench 23.

In device 500, all or substantially all of uppermost surfaces 222A and 222B of dielectric region 222 reside above a generally horizontal plane 182 defined by major surface 18 of region of semiconductor material 11 (or semiconductor layer 14) in contact region 118 at least prior to the formation of Schottky contact region 26. In other examples, a major portion of uppermost surfaces 222A and 222B (e.g., at least 50% or more) reside above horizontal plane 182. In the present example, uppermost surface 222A has a rectangular shape 22D in cross-sectional view, which steps upward going from edge 141 of mesa 140 and adjoins an edge 231 of conductive material 237, which can lie above horizontal plane 182. In the present example, uppermost surface 222B of dielectric region 222 also has a rectangular shape, which is symmetric with reference to a vertical center line passing through the center of conductive material 237.

In some examples of device 500, a major portion of uppermost surfaces 222A and 222B (e.g., at least 50% or more) reside above a generally horizontal plane 183 defined by the upper surface of Schottky contact region 26. In some examples, all or substantially all of uppermost surfaces 222A and 222B reside above at least a portion of the upper surface of Schottky contact region 26. In still further examples, all or substantially all of the uppermost surfaces 222A and 222B reside above the upper surface of Schottky contact region 26.

Figure 6:
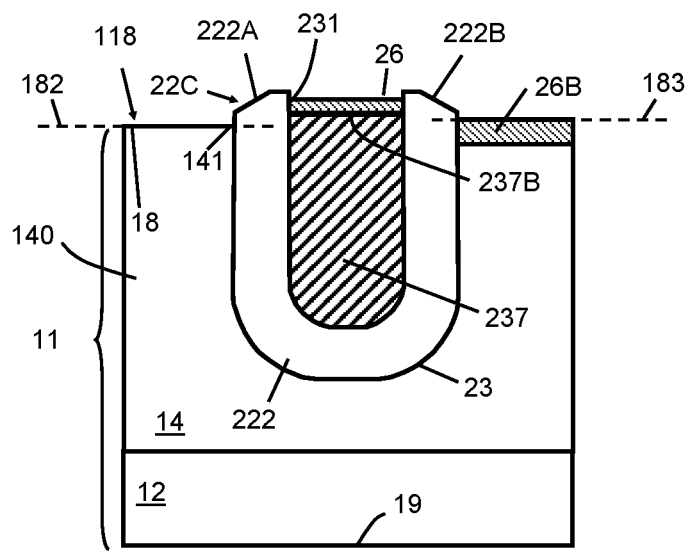

FIG. 6 illustrates a partial cross-sectional view of a portion of a device 600 or a semiconductor device 600 having active trench 23, dielectric region 222, Schottky contact region(s) 26, and conductive material 237. Device 600 is similar to device 400 described previously and only the differences will described hereinafter. In the present example, an uppermost surface 237B of conductive material 237 is recessed below the top portion of uppermost surfaces 222A and 222B of dielectric material 222.

Figure 7:
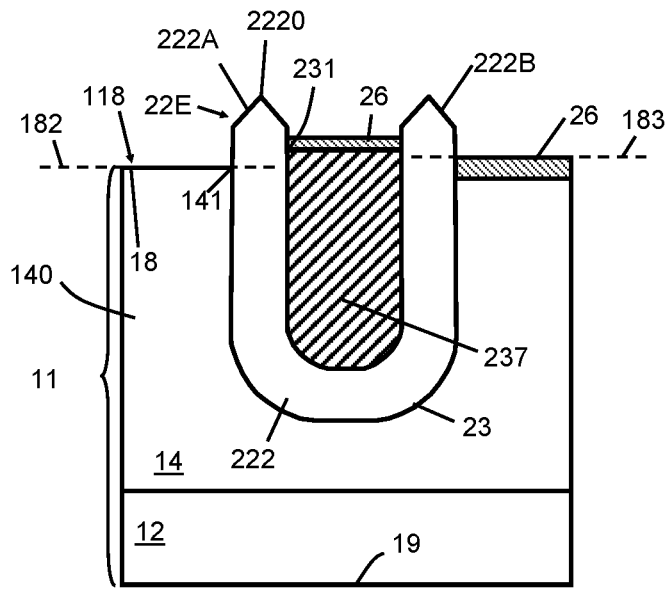

FIG. 7 illustrates a partial cross-sectional view of a portion of a device 700 or a semiconductor device 700 having active trench 23, dielectric region 222, Schottky contact region(s) 26, and conductive material 237. In the present example, contact region 118 of region of semiconductor material 11 at major surface 18 is illustrated on the left side of active trench 23, and a Schottky contact region 26 is illustrated on the right side of active trench 23. This is done for illustration purposes only, and it is understood that in a finished device 700, a Schottky contact region 26 is also provided on the left side of active trench 23.

In device 700, all or substantially all of uppermost surfaces 222A and 222B of dielectric region 222 resides above a generally horizontal plane 182 defined by major surface 18 of region of semiconductor material 11 (or semiconductor layer 14) in contact region 118 at least prior to the formation of Schottky contact region 26. In other examples, a major portion of uppermost surfaces 222A and 222B (e.g., at least 50% or more) reside above horizontal plane 182. In the present example, uppermost surface 222A has a triangular shape or a peaked shape 22E in cross-sectional view, which slopes upward to a substantially centrally located peak portion 2220, and then slopes downward towards conductive material 237, which can lie above horizontal plane 182. In the present example, dielectric region 222 steps up from edge 141 to uppermost surface 222A and steps down from uppermost surface 222A to edge 231. In the present example, uppermost surface 222B of dielectric region 222 also has a triangular shape or peaked shape, which is symmetric with reference to a vertical center line passing through the center of conductive material 237.

In some examples of device 700, a major portion of uppermost surfaces 222A and 222B (e.g., at least 50% or more) reside above a generally horizontal plane 183 defined by the upper surface of Schottky contact region 26. In some examples, all or substantially all of uppermost surfaces 222A and 222B reside above at least a portion of the upper surface of Schottky contact region 26. In still further examples, all or substantially all of the uppermost surfaces 222A and 222B reside above the upper surface of Schottky contact region 26.

Figure 8:
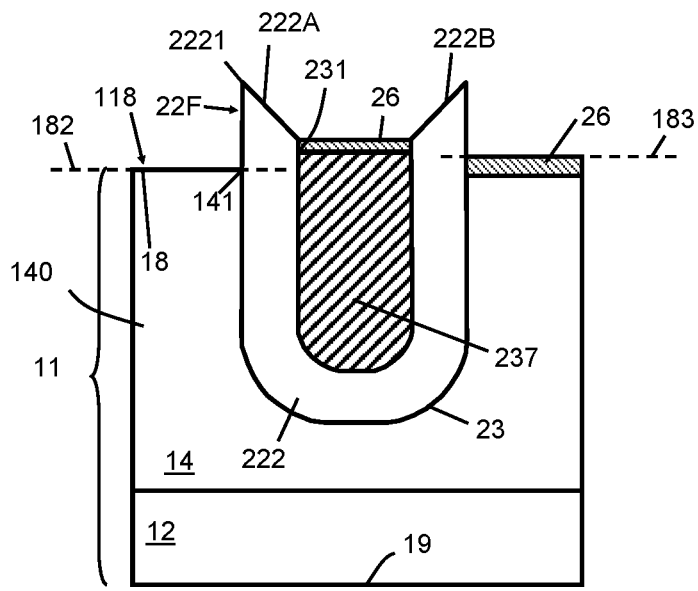

FIG. 8 illustrates a partial cross-sectional view of a portion of a device 800 or a semiconductor device 800 having active trench 23, dielectric region 222, Schottky contact region(s) 26, and conductive material 237. In the present example, contact region 118 of region of semiconductor material 11 at major surface 18 is illustrated on the left side of active trench 23, and a Schottky contact region 26 is illustrated on the right side of active trench 23. This is done for illustration purposes only, and it is understood that in a finished device 800, a Schottky contact region 26 is also provided on the left side of active trench 23.

In device 800, all or substantially all of uppermost surfaces 222A and 222B of dielectric region 222 resides above a generally horizontal plane 182 defined by major surface 18 of region of semiconductor material 11 (or semiconductor layer 14) in contact region 118 at least prior to the formation of Schottky contact region 26. In other examples, a major portion of uppermost surfaces 222A and 222B (e.g., at least 50% or more) reside above horizontal plane 182. In the present example, uppermost surface 222A has a triangular shape 22F in cross-sectional view, which steps generally vertically upward to a peak portion 2221, and then slopes downward towards conductive material 237, which can lie above horizontal plane 182. In the present example, peak portion 2221 is disposed laterally proximate to edge 141 and laterally distal to edge 231. In the present example, uppermost surface 222B of dielectric region 222 also has a triangular shape, which is symmetric with reference to a vertical center line passing through the center of conductive material 237.

In some examples of device 800, a major portion of uppermost surfaces 222A and 222B (e.g., at least 50% or more) reside above a generally horizontal plane 183 defined by the upper surface of Schottky contact region 26. In some examples, all or substantially all of uppermost surfaces 222A and 222B reside above at least a portion of the upper surface of Schottky contact region 26. In still further examples, all or substantially all of the uppermost surfaces 222A and 222B reside above the upper surface of Schottky contact region 26.

Figure 9:
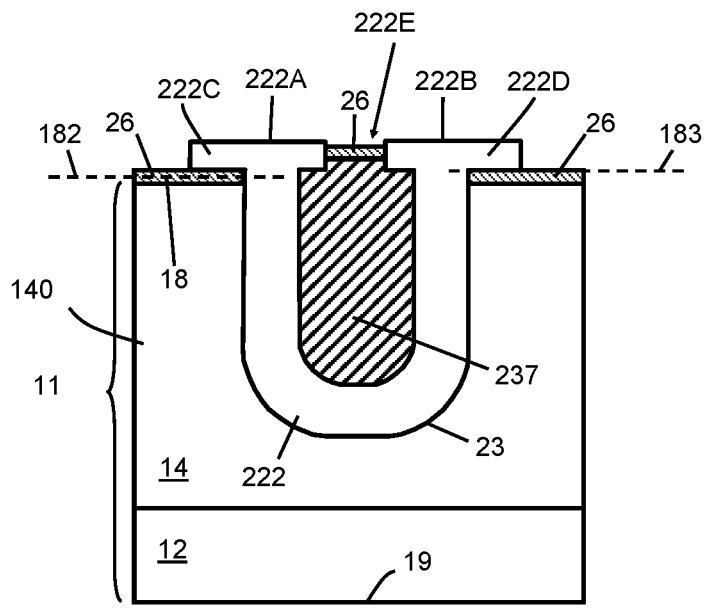

FIG. 9 illustrates a partial cross-sectional view of a portion of a device 900 or a semiconductor device 900 having active trench 23, dielectric region 222, Schottky contact region(s) 26, and conductive material 237. In the present example, dielectric region 222 further comprises portions 222C and 222D that laterally extend to overlap portions of Schottky contact regions 26 and laterally extent to overlap portions of conductive material 237. In some examples, a continuous opening 222E is provided extending inward from uppermost surfaces 222A and 222B to provide electrical contact to conductive material 237. In some examples, contact material 26 used to form Schottky contact regions 26 is provided within opening 222E as generally illustrated in FIG. 9. In some examples, uppermost surfaces 222A and 222B have a rectangular shape in cross-sectional view. It is understood that uppermost surfaces 222A and 222B can have other shapes to place all or substantially all of uppermost surfaces 222A and 222B above horizontal plane 182 established, for example, by major surface 18 of region of semiconductor material 11 before Schottky contact regions 26 are formed. In other examples, a majority portion (e.g., at least 50% or more) of uppermost surfaces 222A and 222B reside above a generally horizontal plane 183 defined by the upper surface of Schottky contact regions 26. In some examples, all or substantially all of uppermost surfaces 222A and 222B reside above at least a portion of the upper surface of Schottky contact regions 26. In still further examples, all or substantially all of the uppermost surfaces 222A and 222B reside above the upper surface of Schottky contact regions 26.

Figure 10:
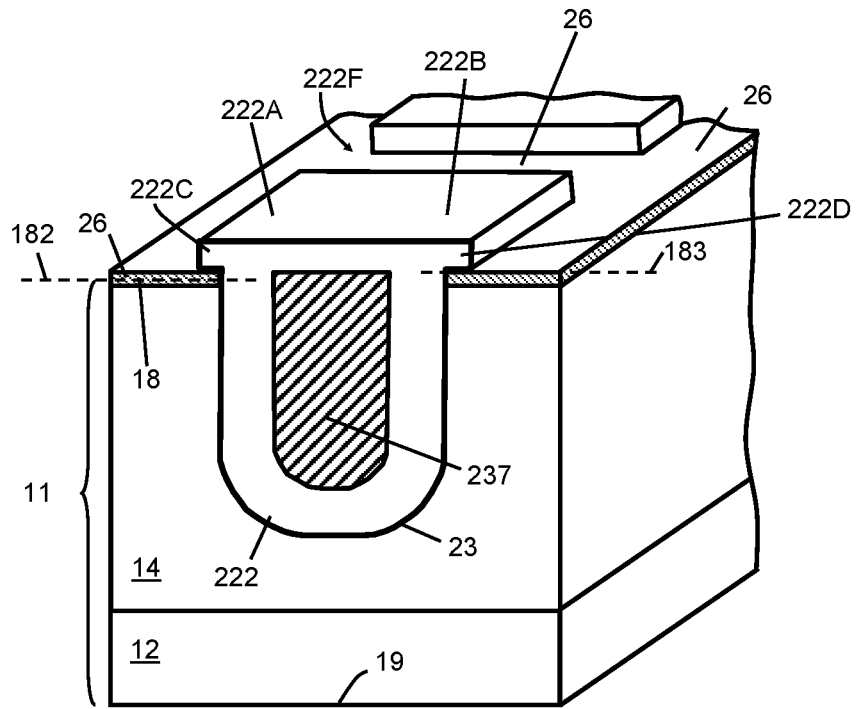
FIG. 10 illustrates a partial and enlarged cross-sectional and perspective view of an example of a semiconductor device in accordance with the present description.

FIG. 10 illustrates a partial cross-sectional and perspective view of a device 950 or semiconductor device 950 having active trench 23, dielectric region 222, Schottky contact region(s) 26, and conductive material 237. Device 950 is similar to device 900 and only the differences will be described hereinafter. In device 950, instead of having a continuous opening 222E as in device 900, periodic opening (s) 222F are provided on an intermittent basis in dielectric regions 222 to provide contact to conductive material 237 with conductive regions 26. Thus, in device 950 there are intermittent portions where dielectric regions 222 completely cover conductive material 237. Similar to device 900, in device 950 uppermost surfaces 222A and 222B (which can be a continuous surface in the present example) have a rectangular shape in cross-sectional view, and all or substantially all of uppermost surfaces 222A and 222B are disposed above horizontal plane 182 established, for example, by major surface 18 of region of semiconductor material 11 before Schottky contact regions 26 are formed. In other examples, a major portion (e.g., at least 50% or more) of uppermost surfaces 222A and 222B reside above a generally horizontal plane 183 defined by the upper surface of Schottky contact regions 26. In some examples, all or substantially all of uppermost surfaces 222A and 222B reside above at least a portion of the upper surface of Schottky contact regions 26. In still further examples, all or substantially all of the uppermost surfaces 222A and 222B reside above the upper surface of Schottky contact regions 26.

In some examples, horizontal plane 182 is different than horizontal plane 183. In other examples, horizontal plane 182 and horizontal plane 183 can be substantially the same or the same plane. In additional examples, horizontal plane 183 can be above horizontal plane 182. In further examples, horizontal plane 182 can be above horizontal plane 183.

In some examples, at least 55% or more of uppermost surfaces 222A and 222B reside above generally horizontal plane 182 and/or generally horizontal plane 183. In other examples, at least 60% or more of uppermost surfaces 222A and 222B reside above generally horizontal plane 182 and/or generally horizontal plane 183. In additional examples, at least 65% or more of uppermost surfaces 222A and 222B reside above generally horizontal plane 182 and/or generally horizontal plane 183. In further examples, at least 70% or more of uppermost surfaces 222A and 222B reside above generally horizontal plane 182 and/or generally horizontal plane 183. In some examples, at least 75% or more of uppermost surfaces 222A and 222B reside above generally horizontal plane 182 and/or generally horizontal plane 183. In other examples, at least 80% or more of uppermost surfaces 222A and 222B reside above generally horizontal plane 182 and/or generally horizontal plane 183. In additional examples, at least 85% or more of uppermost surfaces 222A and 222B reside above generally horizontal plane 182 and/or generally horizontal plane 183. In further examples, at least 90% or more of uppermost surfaces 222A and 222B reside above generally horizontal plane 182 and/or generally horizontal plane 183. In some examples, at least 95% or more of uppermost surfaces 222A and 222B reside above generally horizontal plane 182 and/or generally horizontal plane 183.

Figure 11:
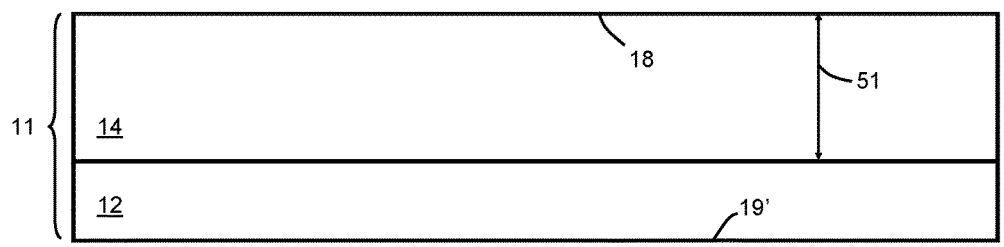
FIGS. 11-21 are partial cross-sectional views illustrating an example method of fabricating a semiconductor device in accordance with the present description.

Turning now to FIGS. 11-21, an example method for forming a semiconductor device, such as devices 10, 200, 300, 400, 500, 600, 700, 800, 900, and 950 will now be described. For purposes of this portion of the description reference to device 10 will be used. In FIG. 11, which is a partial cross-section view of device 10 at an early step in fabrication, region of semiconductor material 11 is provided having substrate 12 with major surface 19' and semiconductor layer 14 with major surface 18. In one example, substrate 12 can be an N-type silicon substrate having a resistivity ranging from about 0.001 ohm-cm to about 0.005 ohm-cm and can be doped with arsenic. In one example, semiconductor layer 14 is provided using epitaxial growth techniques and can be provided having a thickness 51 in a range from approximately 1.0 microns to approximately 15 microns. In some examples, semiconductor layer 14 has a thickness in a range from approximately 1 micron to approximately 15 microns and dopant concentration in a range from approximately $5.0 \times 10^{13}$ atoms/cm$^3$ to approximately $5.0 \times 10^{17}$ atoms/cm$^3$. In some examples, semiconductor layer 14 is N-type and doped with phosphorous.

More particularly, in an example for a 20 volt device, semiconductor layer 14 has a thickness from approximately 1.5 microns to approximately 2.5 microns and a dopant concentration in a range from approximately $1.0 \times 10^{16}$ atoms/cm$^3$ and approximately $1.0 \times 10^{17}$ atoms/cm$^3$. In an example for a 30 volt device, semiconductor layer 14 has a thickness from approximately 2.25 microns to approximately 3.25 microns and a dopant concentration in a range from approximately $1.5 \times 10^{16}$ atoms/cm$^3$ and approximately $8.0 \times 10^{16}$ atoms/cm$^3$. In an example for a 40 volt device, semiconductor layer 14 has a thickness from approximately 2.7 microns to approximately 4.5 microns and a dopant concentration in a range from approximately $1.0 \times 10^{16}$ atoms/cm$^3$ and approximately $6.0 \times 10^{16}$ atoms/cm$^3$.

In some examples, semiconductor layer 14 has a substantially uniform dopant profile along or over its thickness 51. In other examples, semiconductor layer 14 has a non-uniform dopant profile along or over thickness 51. For example, semiconductor layer 14 can have a graded dopant profile where the dopant concentration can decrease from major surface 18 over thickness 51 towards substrate 12. In another example, the dopant concentration can increase over thickness 51 from major surface 18 towards substrate 12. In yet another example, the dopant concentration can first increase and then decrease over thickness 51 from major surface 18 towards substrate 12.

Figure 12:
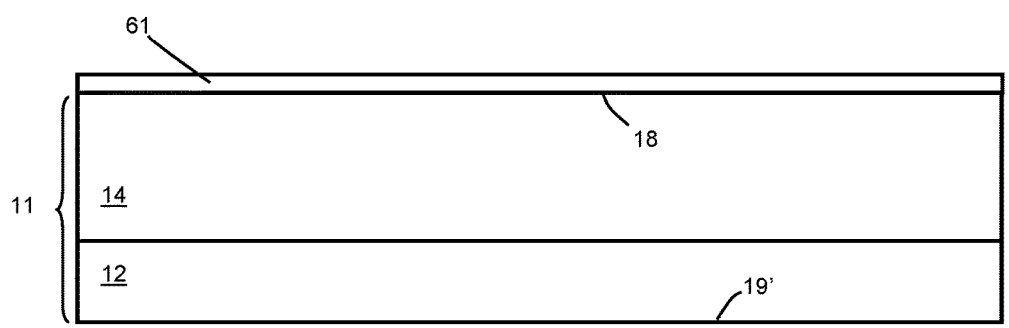
Figure 13:
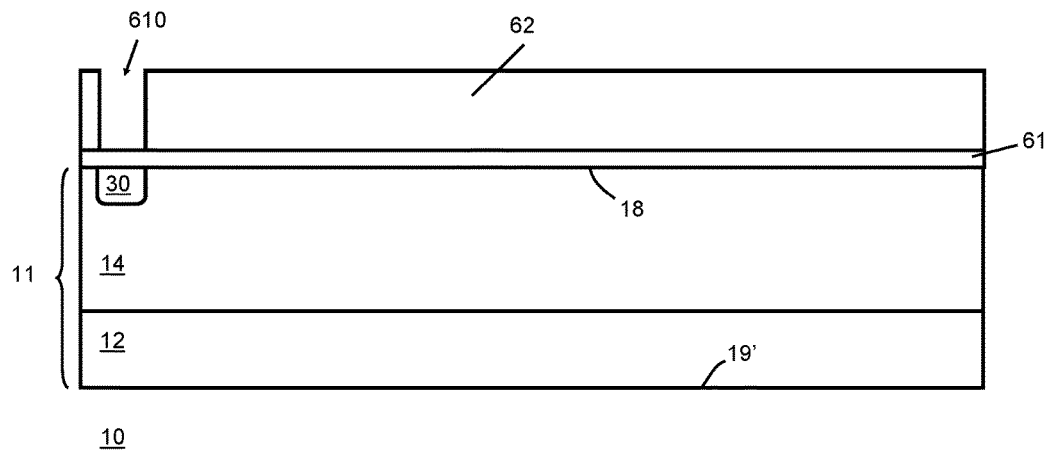

FIG. 12 illustrates device 10 after additional processing. In one example, the structure is subjected to a cleaning process and then a layer 61 can be provided disposed adjacent or overlying major surface 18. In some examples, layer 61 can be a dielectric material, such as an oxide or another material configured for providing a hard mask. In one example, layer 61 is a thermal oxide having a thickness in a range from about 0.03 microns to about 0.5 microns. A masking layer 62 is then provided disposed overlying layer 61 as illustrated in FIG. 13. In one example, masking layer 62 can be a photoresist layer patterned to provide an opening 610 configured in a desired pattern to provide for doped region 30 or edge seal region 30. In one example, doped region 30 is then provided using ion implantation techniques. In some examples, doped region 30 is provided using an arsenic ion implant with an implant dose of approximately $1.0 \times 10^{15}$ atoms/cm$^2$ to approximately 7.0×

$10^{15}$ atoms/cm$^2$ and an implant energy of approximately 100 keV. In some examples, masking layer 62 is then removed. The implanted dopant can be annealed at this step in the process, and/or it can be annealed at a subsequent process step. In some examples, doped region 30 is not used.

Figure 14:
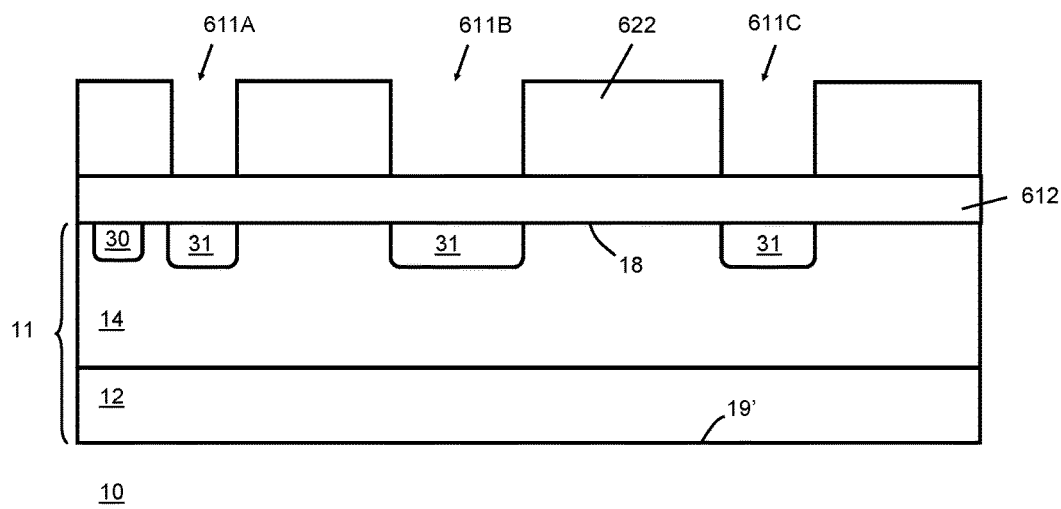

FIG. 14 illustrates device 10 after further processing. In one example, the structure is cleaned and a layer 612 is provided overlying major surface 18. In some examples, layer 612 can be a dielectric layer comprising a thermal oxide having a thickness in range from approximately 0.15 microns to about 0.5 microns. In some examples, layer 612 has a thickness that allows for dopants to be effectively or desirably implanted through the thickness into semiconductor layer 14. Next, a masking layer 622 is provided disposed overlying layer 612. In one example, masking layer 622 comprises a photoresist layer patterned to provide openings 611A, 611B, and 611C for doped regions 31, which can have the same or different dimensions. In example, doped regions 31 are then provided using ion implantation techniques. In some examples, doped regions 31 are provided using a boron ion implant with an implant dose of approximately $6.0 \times 10^{12}$ atoms/cm$^2$ to approximately $1.0 \times 10^{13}$ atoms/cm$^2$ and an implant energy of 300 keV. In some examples, masking layer 622 is then removed. The implanted dopant can be annealed at this step in the process, and/or it can be annealed at a subsequent process step. In some examples, doped regions 31 are not used.

Figure 15:
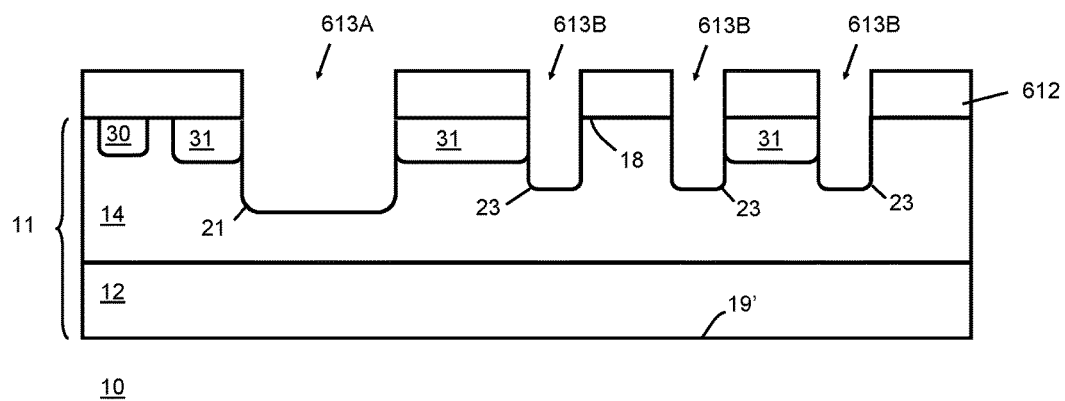

FIG. 15 illustrates device 10 after still further processing. In one example, a masking layer (not shown), such as a patterned photo resist layer, is provided over layer 612. The masking layer is then used to form openings 613A and 613B in layer 612 exposing, for example, portions of major surface 18 of region of semiconductor material 11. In some examples, opening 613A can have a width in a range from approximately 4 microns to approximately 20 microns, and openings 613B can have a width in a range from approximately 0.1 microns to approximately 0.5 microns.

In some examples, a single removal step is used to form both termination trench 21 and active trenches 23, which can have different depths. In some examples, termination trench 21 is deeper than active trenches 23. In other examples, active trenches 23 are deeper than termination trench 21. In one example termination trench 21 and active trenches 23 can be etched using plasma etching techniques with a fluorocarbon chemistry or a fluorinated chemistry (for example, SF$_6$/O$_2$) or other chemistries or removal techniques as known to those skilled in the art. Active trenches 23 can have a depth in a range from approximately 0.5 microns to approximately 4.0 microns. Termination trench 21 can have a depth in a range from approximately 1.0 microns to approximately 10.0 microns.

Figure 16:
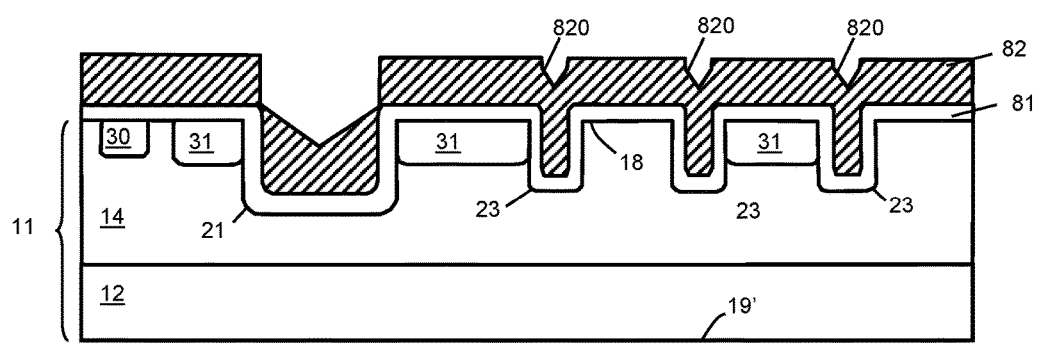

FIG. 16 illustrates device 10 after additional processing. In one example, a layer 81 is formed along surfaces of termination trench 21, surfaces of active trenches 23, and major surface 18. In one example, layer 81 is a dielectric material, such as an oxide, a nitride, tantalum pentoxide, titanium dioxide, barium strontium titanate, high k dielectric materials, combinations thereof, or other related or equivalent materials known by one of ordinary skill in the art. In one example, layer 81 can be a dry oxide having a thickness in a range from approximately 0.05 microns to approximately 0.6 microns. In some examples, layer 81 has a thickness of about 0.4 microns. More particularly, the thickness of layer 81 is selected to leave a gap between adjacent surfaces of layer 81 within active trenches 23 as generally illustrated in FIG. 16. In other examples, the sidewall surfaces of termination trench 21 can be sloped to provide further field shaping effects. In other examples, portions of layer 612 can remain adjacent major surface 18 between termination trench 21 and the edge of region of semiconductor material 11.

Next, a conductive layer 82 is provided adjacent or overlying layer 81. In some examples, conductive layer 82 comprises doped polysilicon provided using LPCVD or PECVD processing techniques. In one example, conductive layer 82 is provided using a silane source gas doped with an N-type dopant, such as phosphorous. In some examples, conductive layer 82 has a thickness in a range from approximately 0.6 microns to about 2.0 microns and has a dopant concentration of $1.0 \times 10^{20}$ atoms/cm$^3$ or more. One artifact of the present method is that notches 820 are formed in the top surface of conductive layer 82 disposed above active trenches 23. It was found through experimentation that notches 820 are a factor in defining the shape of uppermost surfaces 222A and 222B of dielectric regions 222. In prior methods, a blanket or unmasked etch-back step was used to planarize conductive layer 82 all the way back to layer 81. That is, the blanket etch-back step was done until conductive layer 82 was cleared or removed from layer 81 above the horizontal portions of major surface 18. The author's experimentation found that among other things, unless accounted for notches 820 can result in the uppermost surfaces of dielectric regions 222 to have a downward sloping shape from edges 141 of mesas 140 towards conductive material 237. This downward sloping shape resulted in, among other things, a semiconductor device having increased leakage and reduced breakdown voltage performance.

Figure 17:
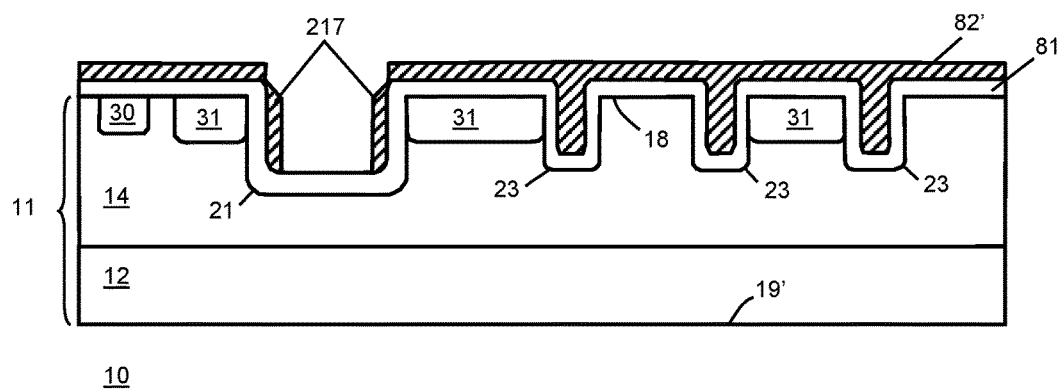
Figure 18:
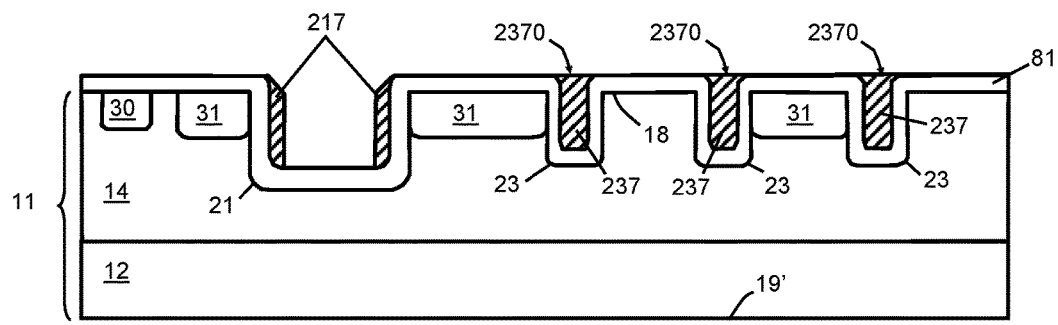

To provide the improved shapes as illustrated in FIGS. 2-10, the authors implemented a modified process to account or compensate for, among other things, the presence of notches 820 in conductive layer 82. FIG. 17 illustrates device 10 after further processing in accordance with the modified process. In accordance with the present example, up to approximately 75% to 85% of conductive layer 82 is removed using the blanket etch process to provide conductive layer 82'. In one example, a wet etch can be used. In other examples, a dry etch can be used. In some examples, approximately 0.14 microns to approximately 0.16 microns of conductive layer 83 remains after the blanket etch process. In one preferred example, approximately 0.15 microns of conductive layer 82 remains after the blanket etch process. In some examples, this thickness was found to provide better electrical performance for device 10 including lower leakage and improved breakdown voltage. Because of the larger width of termination trench 21, in some examples the portion of conductive layer 82 at the bottom of termination trench 21 can clear or etch away thereby leaving conductive spacers 217 proximate to sidewall surfaces of termination trench 21 as generally illustrated in FIG. 17. In a new process step, the remaining 15% to 25% of conductive layer 82 is removed using chemical mechanical planarization (CMP) techniques using layer 81, in some examples, as a stop layer to provide the intermediate structure illustrated in FIG. 18. In some examples, conductive layer 82 is precleaned prior to the CMP process to remove any unwanted, residual, native, or remaining film(s) on the conductive layer 82 that would impede the CMP process. One result from this added step is that portions of conductive layer 82 (which are left within active trenches 23 to provide conductive material 237) can have a flared-out portion 2370 at the upper portion of conductive material 237 proximate to active trenches 23. In the previous method, conductive material 82 was recessed below the upper surface of layer 81 because of etch control or required over-etching.

Figure 19:
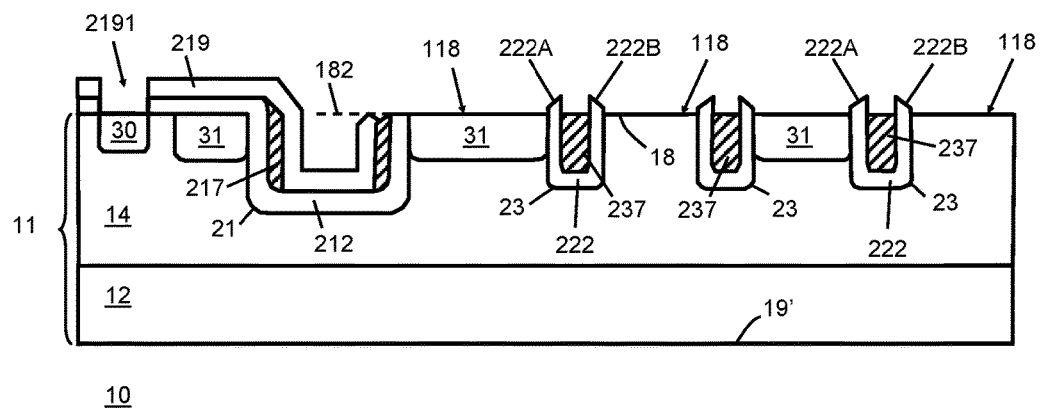

FIG. 19 illustrates device 10 after still further processing. In some examples, a layer of material is provided adjacent major surface 18. In one example, the layer of material can be a TEOS oxide deposited using a PECVD process or an LPCVD process, and can have a thickness in range from approximately 0.35 microns to approximately 0.7 microns. Next, a contact masking step and removal step can be used to leave a portion of the layer of material within termination trench 21 to provide dielectric layer 219. The masking and removal steps can further remove portions of layer 81 from the active region of device 10 to expose portions of major surface 18 to provide contact regions 118 and to provide an opening 2191 to doped region 30. This step provides dielectric layer 212 within termination trench 21 and dielectric layers 222 within active trenches 23. The masking and removal steps can also remove portions of conductive material 237 within active trenches 23 to provide the upper surfaces of conductive material 237 at a desired location within active trenches 23.

In accordance with the present description, in some examples flared-out portions 2370 beneficially result in all or substantially all of uppermost surfaces 222A and 222B to be above horizontal plane 182 with respect to major surface 18 after the masking and removal step. In other examples, the mask used to provide contact regions 118 is modified to protect portions of layer 81 proximate to active trenches 23 to provide the shapes of uppermost regions 222A and 222B as illustrated in FIGS. 2-10. This can be combined with removal steps, such as selective etching, directional milling or etching, or anisotropic etching to provide the desired shapes of uppermost regions 222A and 222B. The resulting shapes of uppermost surfaces 222A and 222B of dielectric regions 222 are an improvement over the previous process and provides device 10 with improved performance and reliability.

Figure 20:
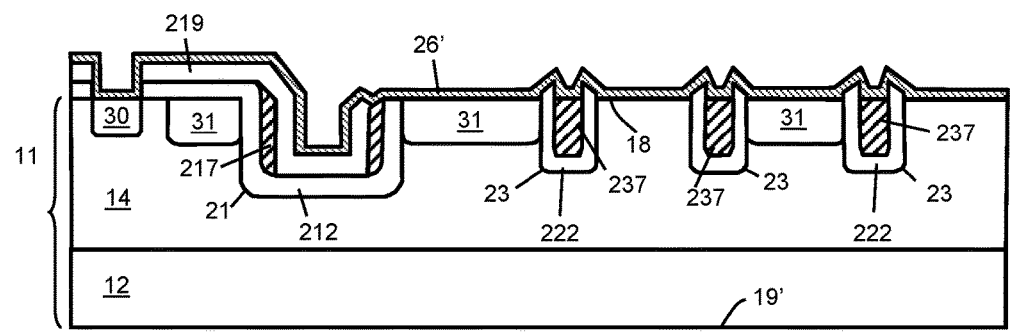
Figure 21:
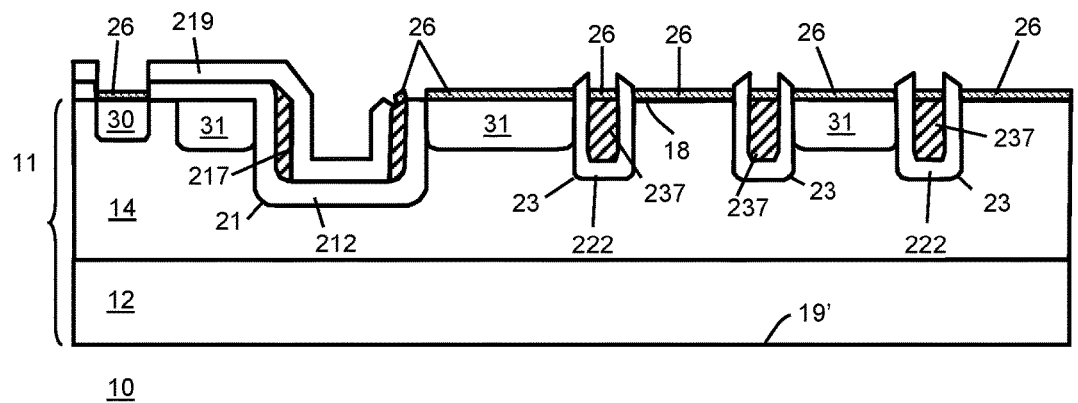

FIG. 20 illustrates device 10 after additional processing. In some examples, the structure is cleaned and then a conductive layer 26' is provided overlying major surface 18. In some examples, conductive layer 26' comprises a material configurable to provide a Schottky barrier with semiconductor layer 14 or regions of semiconductor material 11. Such materials can include platinum, nickel-platinum, titanium, titanium-tungsten, chromium, and/or other materials capable of forming a Schottky barrier as known to those skilled in the art. In some examples, conductive layer 26' can be heat treated or annealed to provide silicide regions and then portions of conductive layer 26' are removed to provide conductive material 26 or Schottky contact regions as illustrated in FIG. 21. In accordance with the present example, a portion of conductive material 26 is provided on at least one of conductive spacers 217 as generally illustrated in FIG. 21. This provides for improved electrical contact between conductive spacer 217 and conductive layer 44, which can be formed in a subsequent step.

In subsequent steps, conductive layer 44 is provided overlying major surface 18 as illustrated in FIG. 1. In some examples, conductive layer 44 can be titanium/titanium-nitride/aluminum-copper or other related or equivalent materials known to those skilled in the art and is configured as first current carrying electrode or terminal 440 or an anode electrode 440 for device 10. Next, substrate 12 can be thinned to decrease its thickness using, for example, a grinding process to provide major surface 19. Conductive layer 46 can then be provided on major surface 19 as described and illustrated in FIG. 1. In some examples, conductive layer 46 can be a solderable metal structure such as titanium-nickel-silver, chromium-nickel-gold, or other related or equivalent materials known by those skilled in the art. In the example illustrated, conductive layer 46 provides a second current carrying electrode or terminal 460 or a cathode electrode 460 for device 10.

In view of all of the above, it is evident that a novel structure and method of making the structure are disclosed. Included, among other features, is a shaped gate dielectric region proximate to a portion of the semiconductor device where a Schottky contact region is formed, and another portion of the semiconductor device where the gate electrode adjoins a major surface of the semiconductor device. More particularly, the shaped gate dielectric region comprises an uppermost surface having a profile in cross-sectional view other than a substantially downward sloping profile between where the gate dielectric region adjoins the semiconductor material where the Schottky contact region is to be formed and where the gate dielectric region adjoins the gate electrode. More particularly, a major portion (e.g., at least 50% or more) of the uppermost surface of the gate dielectric region resides above a plane defined by a major surface of the contact region of the semiconductor material where the Schottky contact region is to be formed. In some examples, all or substantially all of the uppermost surface of the gate dielectric region resides above a plane defined by a major surface of the semiconductor material after a contact etch step is completed during fabrication where the Schottky contact is to be formed. In other examples, a major portion (e.g., at least 50% or more) of the uppermost surface of the gate dielectric region resides above a plane defined by an upper surface of the Schottky contact region. In further examples, all or substantially all of the uppermost surface of the gate dielectric region resides above a plane defined by the uppermost surface of the Schottky contact region. The structure and method provide a semiconductor device with improved performance and reliability.

While the subject matter of the invention is described with specific preferred embodiments and example embodiments, the foregoing drawings and descriptions thereof depict only typical examples of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A semiconductor device comprising:
   a region of semiconductor material having first and second opposing major surfaces;
   a trench structure comprising:
      a trench extending into the region of semiconductor material from the first major surface, wherein the first major surface defines a first horizontal plane in a cross-sectional view; and
      a conductive material disposed within the trench and separated from the region of semiconductor material by a dielectric region; and
   a Schottky contact region disposed adjacent the first major surface on opposing sides of the trench structure, the Schottky contact region having an upper surface residing on a second horizontal plane in the cross-sectional view, wherein:
the dielectric region is disposed along opposing sidewall surfaces of the trench and disposed along a lower surface of the trench;
the dielectric region comprises a first uppermost surface;
a major portion of the first uppermost surface is disposed above the first horizontal plane in the cross-sectional view; and
the first uppermost surface has a sloped shape in the cross-sectional view.

2. The semiconductor device of claim 1, wherein:
the first uppermost surface of the dielectric region extends above an upper surface of the conductive material in the cross-sectional view.

3. The semiconductor device of claim 1, wherein:
the Schottky contact region is disposed on a mesa portion of the region of semiconductor material adjacent to the trench; and
the sloped shape comprises a first portion that steps upward from an edge of the mesa portion and upwardly slopes in a direction towards the conductive material.

4. The semiconductor device of claim 1, wherein:
at least a portion of the sloped shape comprises a triangular shape.

5. The semiconductor device of claim 1, wherein:
the sloped shape comprises a trapezoid shape.

6. The semiconductor device of claim 1, wherein:
the Schottky contact region comprises a portion adjoining an upper surface of the conductive material; and
the portion adjoining the upper surface of the conductive material is disposed at least in part above the second horizontal plane in the cross-sectional view.

7. The semiconductor device of claim 1, wherein:
the sloped shape further comprises a stepped portion in the cross-sectional view.

8. The semiconductor device of claim 1, wherein:
substantially all of the first uppermost surface is disposed above the first horizontal plane in the cross-sectional view.

9. The semiconductor device of claim 1, wherein:
a major portion of the first uppermost surface is disposed above the second horizontal plane in the cross-sectional view.

10. The semiconductor device of claim 1, wherein:
the Schottky contact region is configured having an inward facing surface having a concave shape with respect to the first major surface.

11. The semiconductor device of claim 1, wherein
the Schottky contact region is configured having an inward facing surface having a convex shape with respect to the first major surface.

12. A semiconductor device comprising:
a region of semiconductor material having first and second opposing major surfaces;
a trench structure comprising:
a trench extending into the region of semiconductor material from the first major surface, wherein the first major surface defines a first horizontal plane in a cross-sectional view; and
a conductive material disposed within the trench and separated from the region of semiconductor material by a dielectric region; and
a Schottky contact region disposed adjacent the first major surface on opposing sides of the trench structure, the Schottky contact region having an upper surface residing on a second horizontal plane in the cross-sectional view, wherein:
the dielectric region is disposed along opposing sidewall surfaces of the trench and disposed along a lower surface of the trench;
the dielectric region comprises a first uppermost surface;
a major portion comprising 50% or more of the first uppermost surface is disposed above the first horizontal plane in the cross-sectional view; and
the first uppermost surface comprises a stepped shape in the cross-sectional view.

13. The semiconductor device of claim 12, wherein:
a portion of the first uppermost surface further comprises a sloped shape.

14. The semiconductor device of claim 12, wherein:
the Schottky contact region comprises another portion adjoining an upper surface of the conductive material; and
the portion adjoining the upper surface of the conductive material is disposed at least in part above the second horizontal plane in the cross-sectional view.

15. The semiconductor device of claim 12, wherein:
substantially all of the first uppermost surface is disposed above the first horizontal plane in the cross-sectional view.

16. The semiconductor device of claim 12, wherein:
a major portion of the first uppermost surface is disposed above the second horizontal plane in the cross-sectional view.

17. A method of forming a semiconductor device, comprising:
providing a region of semiconductor material having first and second opposing major surfaces;
forming a trench extending into the region of semiconductor material from the first major surface;
forming a first layer of material overlying surfaces of the trench and the first major surface, the first layer of material comprising a dielectric material;
forming a second layer of material overlying the first layer of material, the second layer of material comprising a conductive material, wherein the second layer of material comprises a notch extending inward from an upper surface of the second layer of material above the trench;
removing a first portion of the second layer of material using an etch planarization step;
removing a second portion of the second layer of material using a different planarization step, wherein the step of removing the second portion of the second layer of material provides conductive material within the trench comprising a flared-out portion proximate to an upper surface of the conductive material;
removing a portion of the first layer of material to expose portions of the first major surface and to provide a dielectric region within the trench, wherein:
the dielectric region separates the conductive material from the region of semiconductor material;
the dielectric material comprises an uppermost surface; and
a major portion of the uppermost surface is disposed above a first horizontal plane defined by the exposed portions of the first major surface in a cross-sectional view; and forming a Schottky contact region adjacent at least one of the exposed portions of the first major surface adjoining the trench.

18. The method of claim 17, wherein:

removing the first portion of the second layer of material comprises providing the second portion of the second layer of material having a thickness of approximately 0.15 microns;

removing the second portion of the second layer of material comprises using chemical mechanical planarization; and removing the portion of the first layer of material includes providing the major portion comprising 50% or more of the uppermost surface disposed above the first horizontal plane.

19. The method of claim 17, wherein:

removing a portion of the first layer of material comprises providing the dielectric region where substantially all of the uppermost surface is disposed above the first horizontal plane; and the method further comprises cleaning the second layer of material to remove any residual film before removing the second portion.

20. The method of claim 17, wherein:

forming the Schottky contact region comprises forming the Schottky contact region having an upper surface defining a second horizontal plane in the cross-sectional view; and a major portion comprising 50% or more of the uppermost surface is disposed above the second horizontal plane.

* * * * *